(12) United States Patent
Hung et al.

(10) Patent No.: US 8,149,624 B1
(45) Date of Patent: Apr. 3, 2012

(54) METHOD AND APPARATUS FOR REDUCING READ DISTURB IN MEMORY

(75) Inventors: Chun-Hsiung Hung, Hsinchu (TW); Shuo-Nan Hung, Jhubei (TW); Tseng-Yi Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 21 days.

(21) Appl. No.: 12/878,358

(22) Filed: Sep. 9, 2010

(51) Int. Cl.
*G11C 16/04* (2006.01)

(52) U.S. Cl. ......... 365/185.19; 365/185.15; 365/185.24; 365/185.22

(58) Field of Classification Search ............. 365/185.19, 365/185.17, 185.24, 185.22
See application file for complete search history.

(56) References Cited

U.S. PATENT DOCUMENTS

| | | | |
|---|---|---|---|
| 7,310,267 B2 | 12/2007 | Youn | |
| 7,675,783 B2 * | 3/2010 | Park et al. | 365/185.24 |

\* cited by examiner

*Primary Examiner* — Thong Q Le
(74) *Attorney, Agent, or Firm* — Kenta Suzue; Haynes Beffel & Wolfeld LLP

(57) ABSTRACT

Various aspects of a NAND memory include have multiple versions of a high threshold voltage distribution—a version with a reduced maximum, and another version. The version with a reduced maximum has a reduced word line pass voltage.

20 Claims, 7 Drawing Sheets

METHOD AND APPARATUS FOR REDUCING READ DISTURB IN MEMORY

BACKGROUND

Description of Related Art

Read disturb presents a serious problem to the operation of nonvolatile memory cells such as floating gate and charge trapping memory cells. Read disturb occurs when read operations are performed on nonvolatile memory cells; despite being applied for a read operation rather than a program operation, some programming still occurs while applying a read bias arrangement. Over the course of many read operations, read disturb changes raise the threshold voltage of the affected nonvolatile memory cells.

Read disturb occurs in NAND strings because the read bias arrangement voltage Vpass is sufficiently high to cause programming. In a NAND string of nonvolatile memory cells arranged in series, a read voltage Vread is applied to the word line of a selected memory cell in the NAND string, and a pass voltage Vpass is applied to the word line of unselected memory cell in the NAND string.

FIG. 1 is a graph of threshold voltages distributions, showing the HVt and LVt distributions, the word line read voltage window and the word line pass voltage window. Vpass is sufficiently high to turn on the channel under unselected memory cells in the NAND string regardless of the data values stored on the unselected memory cells. In particular, Vpass is sufficiently high to turn on the channel under a memory cell storing the data value associated with the highest threshold voltage distribution. Vread is sufficiently high to turn on the channel under a selected memory cells in the NAND string with a data value associated with a threshold voltage distribution that is lower than Vread, and is sufficiently low to turn off the channel under a selected memory cells in the NAND string with a data value associated with a threshold voltage distribution that is higher than Vread.

SUMMARY

Various aspects approach the read disturb problem by reducing the Vpass voltage. Typically, the Vpass voltage exceeds the highest threshold voltage distribution, so that regardless of the data values stored on the unselected memory cells of a NAND string, the channel is turned on under unselected memory cells of a NAND string. However, various embodiments reduce the Vpass voltage by reducing a maximum of a high threshold voltage distribution.

A first aspect has multiple versions of a high threshold voltage distribution—a version with a reduced maximum, and another version, with the particular version depending on the instructions. A second aspect has multiple versions of a high threshold voltage distribution—a version with a reduced maximum, and another version, with the particular version depending on the instructions, depending on the instruction register. A third aspect is a corresponding method. Various aspects are discussed below.

A first aspect of the technology is a memory with a plurality of memory cells, a plurality of word lines, and control circuitry.

The plurality of memory cells is arranged in series in a semiconductor body. The series has a first end and a second end. Memory cells in the plurality of memory cells have a threshold voltage in one of a first threshold voltage distribution associated with a first data value and a second threshold voltage distribution associated with a second data value. The first threshold voltage distribution is a lower voltage distribution than the second threshold voltage distribution.

Word lines in the plurality of word lines are coupled to corresponding memory cells in the plurality of memory cells. The control circuit is coupled to the plurality of word lines. The control circuit having multiple sets of instructions, including a first set of instructions and a second set of instructions.

The first set of instructions includes program and read instructions. The first set of instructions corresponds to a first version of the second threshold voltage distribution associated with the second data value. The first version of the second threshold voltage distribution has having a first version distribution maximum.

The second set of instructions includes program and read instructions. The second set of instructions corresponds to a second version of the second threshold voltage distribution associated with the second data value. The second version of the second threshold voltage distribution has a second version distribution maximum.

The first version distribution maximum is larger than the second version distribution maximum.

In one embodiment, the first version of the second threshold voltage distribution is wider than the second version of the second threshold voltage distribution.

In one embodiment, the control circuit performs incremental step pulse programming with an incremental step. The incremental step is larger with the program instruction in the first set of instructions than the program instruction in the second set of instructions.

In one embodiment, the program instruction in the first set of instructions is faster than the program instruction in the second set of instructions.

In one embodiment, the read instruction in the first set of instructions applies a first read bias arrangement to word lines of the plurality of word lines. The first read bias arrangement applies a first pass voltage to unselected word lines of the plurality of word lines.

The read instruction in the second set of instructions applies a second read bias arrangement to word lines of the plurality of word lines. The second read bias arrangement applies a second pass voltage to unselected word lines of the plurality of word lines. The first pass voltage is larger than the second pass voltage.

In one embodiment, the memory includes the plurality of memory cells and an additional plurality of memory cells. The control circuit uses the first set of instructions with the plurality of memory cells, and the control circuit uses the second set of instructions with the additional plurality of memory cells. Data stored in the additional plurality of memory cells is less susceptible to error than data stored in the plurality of memory cells.

A second aspect of the technology is a memory with a plurality of memory cells, a plurality of word lines, an instruction register, and control circuitry.

The instruction register stores one of a first value and a second value.

Responsive to the instruction register storing the first value, the program and read instructions correspond to a first version of the second threshold voltage distribution associated with the second data value. The first version of the second threshold voltage distribution has a first version distribution maximum.

Responsive to the instruction register storing the second value, the program and read instructions correspond to a second version of the second threshold voltage distribution associated with the second data value. The second version of the second threshold voltage distribution has a second version distribution maximum.

The first version distribution maximum is larger than the second version distribution maximum.

In one embodiment, the first version of the second threshold voltage distribution is wider than the second version of the second threshold voltage distribution.

In one embodiment, the control circuit performs incremental step pulse programming with an incremental step. The incremental step is larger with the instruction register storing the first value than with the instruction register storing the second value.

In one embodiment, the program instruction in the first set of instructions is faster than the program instruction in the second set of instructions.

In one embodiment, responsive to the instruction register storing the first value, the read instruction applies a first read bias arrangement to word lines of the plurality of word lines, and the first read bias arrangement applies a first pass voltage to unselected word lines of the plurality of word lines.

Responsive to the instruction register storing the second value, the read instruction applies a second read bias arrangement to word lines of the plurality of word lines, and the second read bias arrangement applies a second pass voltage to unselected word lines of the plurality of word lines.

The first pass voltage is larger than the second pass voltage.

In one embodiment, the memory includes the plurality of memory cells and an additional plurality of memory cells. The control circuit uses the program and read instructions with the instruction register storing the first value with the plurality of memory cells, and the control circuit uses the program and read instructions with the instruction register storing the second value with the additional plurality of memory cells. Data stored in the additional plurality of memory cells is less susceptible to error than data stored in the plurality of memory cells.

A third aspect of the technology is a method of using pluralities of memory cells arranged in series in a semiconductor body. The series has a first end and a second end. Memory cells in the plurality of memory cells have a threshold voltage in one of a first threshold voltage distribution associated with a first data value and a second threshold voltage distribution associated with a second data value. The first threshold voltage distribution is a lower voltage distribution than the second threshold voltage distribution. The method comprises:

using a first version of program and read instructions corresponding to a first version of the second threshold voltage distribution associated with the second data value, the first version of the second threshold voltage distribution having a first version distribution maximum; and using a second version of program and read instructions corresponding to a second version of the second threshold voltage distribution associated with the second data value, the second version of the second threshold voltage distribution having a second version distribution maximum.

wherein the first version distribution maximum is larger than the second version distribution maximum.

In one embodiment, the first version of the second threshold voltage distribution is wider than the second version of the second threshold voltage distribution.

One embodiment further comprises:

performing incremental step pulse programming with an incremental step, wherein the incremental step is larger with the first version of the program instruction than with the second version of the program instruction.

In one embodiment, the first version of the program instruction is faster than the second version of the program instruction.

In one embodiment, the first version of the read instruction applies a first read bias arrangement to word lines of a plurality of word lines accessing a plurality of memory cells, and the first read bias arrangement applies a first pass voltage to unselected word lines of the plurality of word lines, wherein the second version of the read instruction applies a second read bias arrangement to word lines of the plurality of word lines, and the second read bias arrangement applies a second pass voltage to unselected word lines of the plurality of word lines, wherein the first pass voltage is larger than the second pass voltage.

In one embodiment, data programmed and read with the second version of program and read instructions is less susceptible to error than data programmed and read with the first version of program and read instructions.

In one embodiment, the first version of program and read instructions have different instruction codes than the second version of program and read instructions.

In one embodiment, the first version of program and read instructions share common instruction codes with the second version of program and read instructions, and contents of an instruction register distinguish the first version of program and read instructions from the second version of program and read instructions.

DETAILED DESCRIPTION

Figure 1:
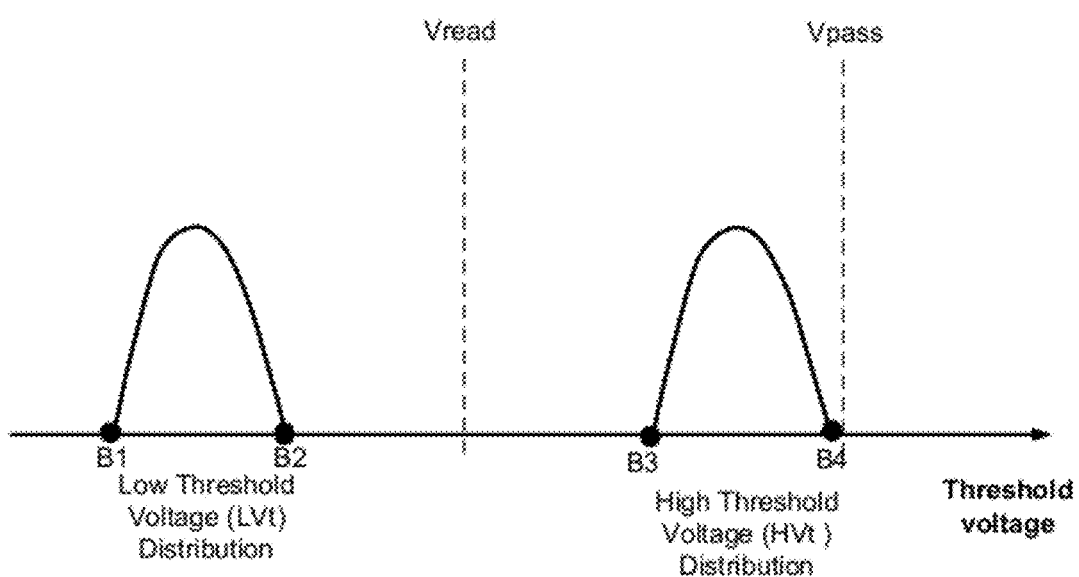
FIG. 1 is a graph of threshold voltages distributions, showing the HVt and LVt distributions, a word line read voltage and a word line pass voltage.
Figure 2:
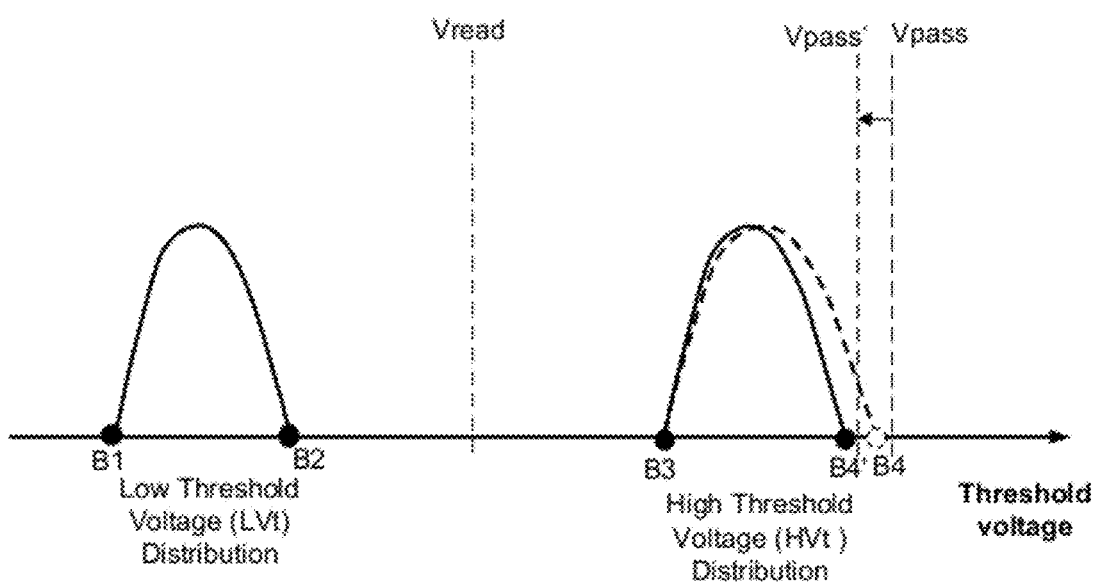
FIG. 2 is a graph of threshold voltages distributions, showing the modified HVt distribution with a reduced maximum.

FIG. 2 is a graph of threshold voltages distributions, showing the modified HVt distribution with a reduced maximum.

Vpass' is sufficiently high to turn on the channel under unselected memory cells in the NAND string regardless of the data values stored on the unselected memory cells. In particular, Vpass' is sufficiently high to turn on the channel under a memory cell storing the data value associated with the highest threshold voltage distribution HVt which has had the maximum reduced from B4 to B4'. Vread is sufficiently high to turn on the channel under a selected memory cells in the NAND string with a data value associated with a threshold voltage distribution that is lower than Vread, and is sufficiently low to turn off the channel under a selected memory cells in the NAND string with a data value associated with a threshold voltage distribution that is higher than Vread.

The read disturb problem is addressed, because the Vpass voltage is reduced.

Figure 3:
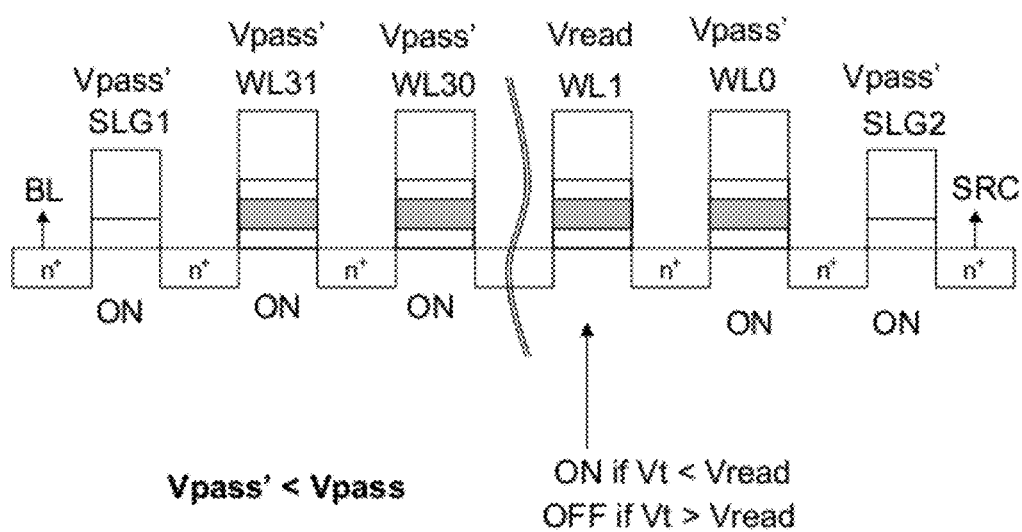
FIG. 3 is a diagram of a NAND string of nonvolatile memory cells, applying a modified word line pass voltage corresponding to the modified HVt distribution with a reduced maximum.

FIG. 3 is a diagram of a NAND string of nonvolatile memory cells, applying a modified word line pass voltage corresponding to the modified HVt distribution with a reduced maximum.

The NAND string between the bit line BL and the source line SRC has a series of nonvolatile memory cells between pass transistors. A diffusion region is between adjacent transistor/memory cell structures. Alternatively, the diffusion region can be removed, and replaced with an inversion region by adding a gate structure which applies an appropriate voltage.

Vread is applied to the word line of the memory cell selected for reading. Vpass' is applied to the other word lines of the memory cells not selected for reading. Typically, Vpass' is applied to turn on the underlying channel regardless of the particular data value and its associated threshold voltage distribution that is stored, and Vpass' is accordingly set to be high enough to turn on the underlying channel in case a data value associated with a high threshold voltage distribution is stored.

Figure 4:
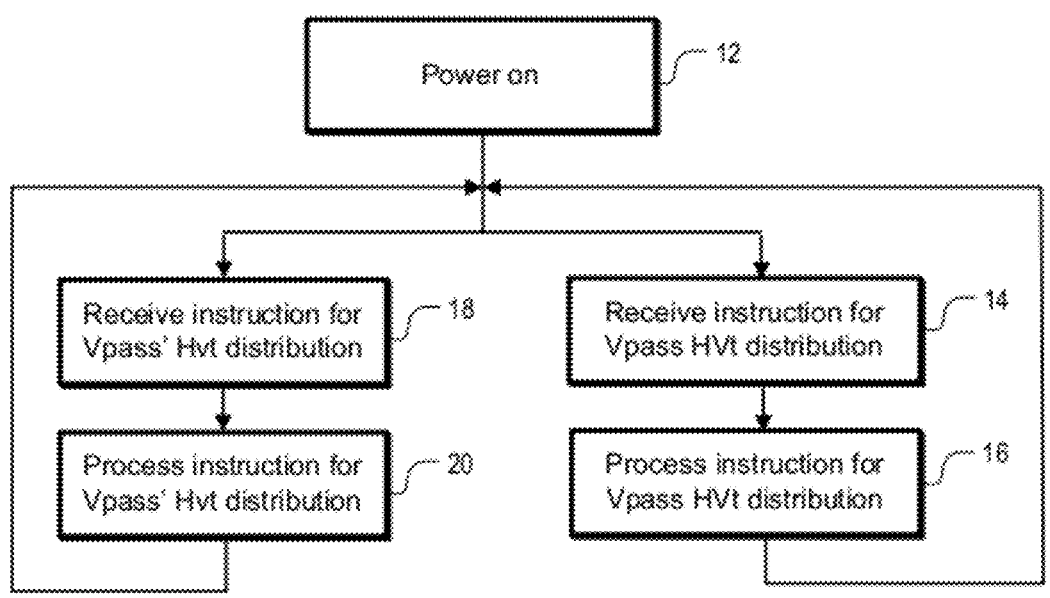
FIG. 4 is a flowchart of the different instructions for a typical HVt distribution with a typical word line pass voltage, and a modified HVt distribution with a reduced maximum and a reduced word line pass voltage.

FIG. 4 is a flowchart of the different instructions for a typical HVt distribution with a typical word line pass voltage, and a modified HVt distribution with a reduced maximum and a reduced word line pass voltage.

In 12, power on occurs. In 14, an instruction is received with an instruction code for a typical Vpass voltage that is greater than the unreduced maximum of the highest threshold voltage distribution, typically along with the address of the memory cell. In 16, the instruction is processed. The instruction may be read or program.

In 18, an instruction is received with an instruction code for a reduced Vpass' voltage that is greater than the reduced maximum of the highest threshold voltage distribution, typically along with the address of the memory cell. In 20, the instruction is processed. The instruction may be read or program.

Figure 5:
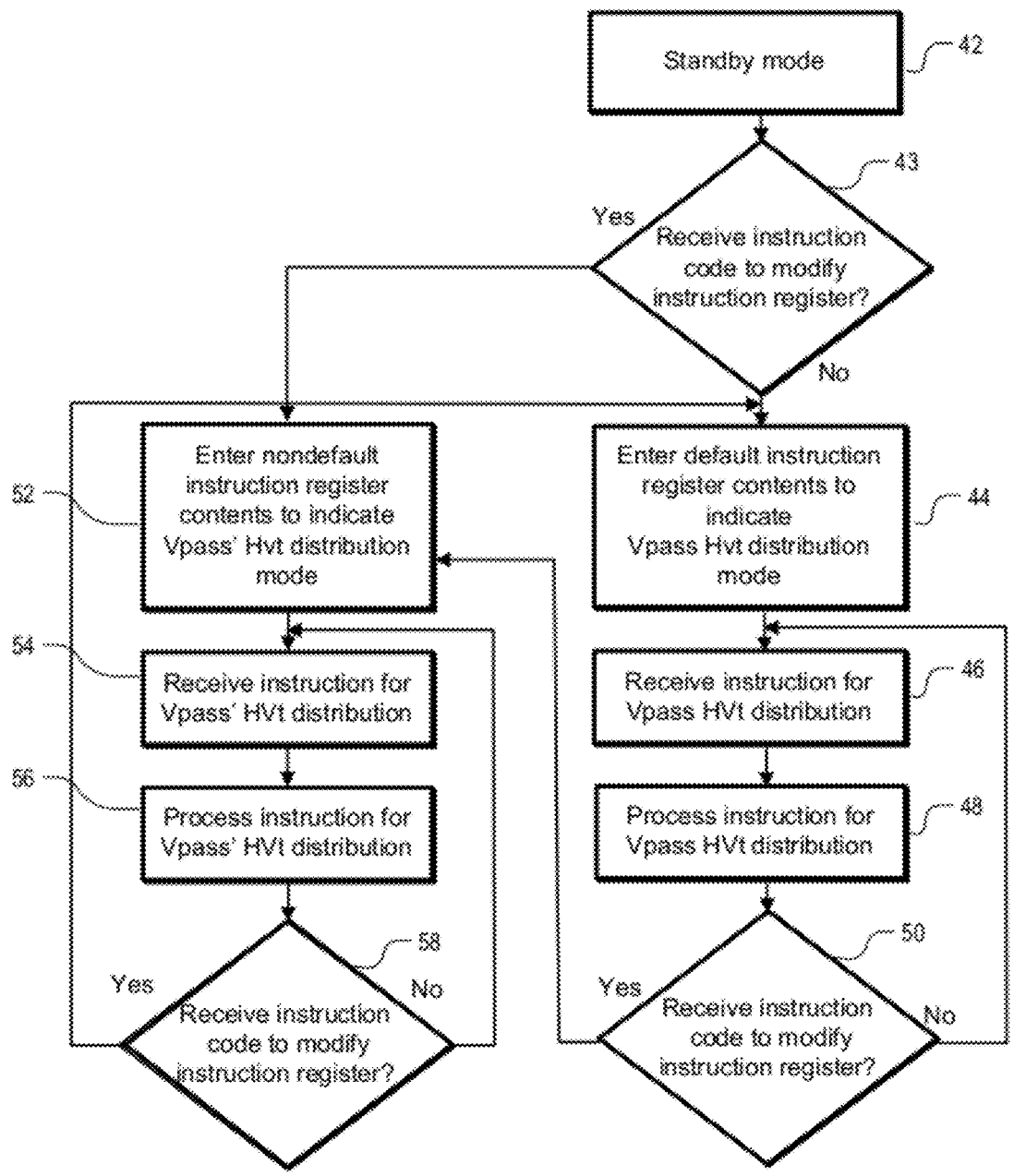
FIG. 5 is a flowchart of the different instruction register values for a typical HVt distribution with a typical word line pass voltage, and a modified HVt distribution with a reduced maximum and a reduced word line pass voltage.

FIG. 5 is a flowchart of the different instruction register values for a typical HVt distribution with a typical word line pass voltage, and a modified HVt distribution with a reduced maximum and a reduced word line pass voltage.

In 42, standby mode occurs. In 43, if an instruction code is not received to modify the instruction register contents, the process continues to 44. Otherwise, the process continues with 52.

In 44, default instruction register contents are entered to indicate that the control circuitry is in the mode of using a typical Vpass voltage that is greater than the unreduced maximum of the highest threshold voltage distribution, typically along with the address of the memory cell. In 46, an instruction is received with an instruction code for a typical Vpass voltage that is greater than the unreduced maximum of the highest threshold voltage distribution, typically along with the address of the memory cell. In 48, the instruction is processed. The instruction may be read or program.

In 50, if an instruction code is not received to modify the instruction register contents, the process returns to 46. Otherwise, the process continues with 52.

In 52, nondefault instruction register contents are entered to indicate that the control circuitry is in the mode of using a reduced Vpass' voltage that is greater than the reduced maximum of the highest threshold voltage distribution, typically along with the address of the memory cell. In 54, an instruction is received with an instruction code for a reduced Vpass' voltage that is greater than the reduced maximum of the highest threshold voltage distribution, typically along with the address of the memory cell. In 56, the instruction is processed. The instruction may be read or program.

In 58, if an instruction code is not received to modify the instruction register contents, the process returns to 54. Otherwise, the process continues with 44.

Figure 6:
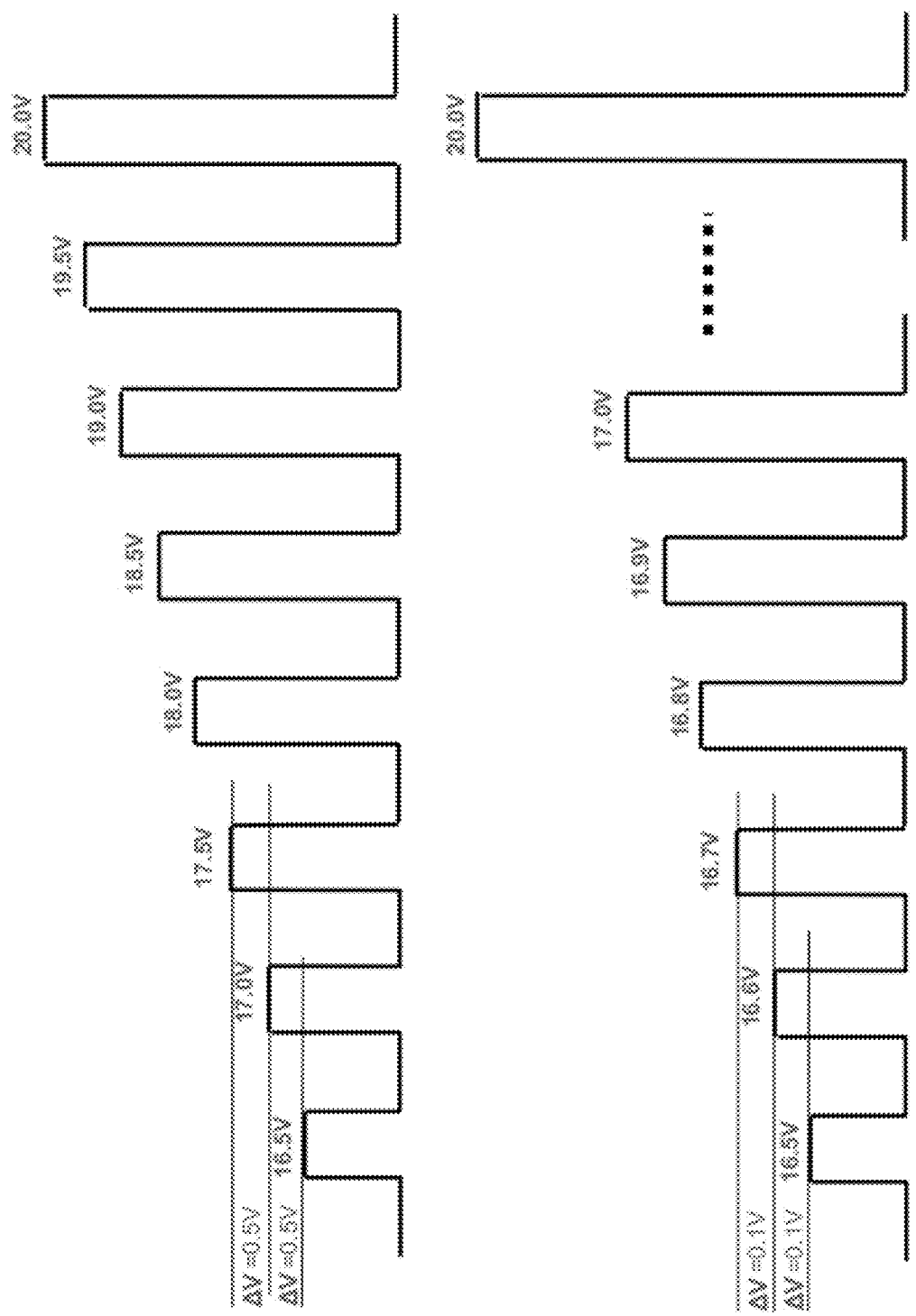
FIG. 6 is a graph of different incremental step pulse programming, with an incremental step that varies, depending on the particular HVt distribution—a typical one, or one with a reduced maximum.

FIG. 6 is a graph of different incremental step pulse programming, with an incremental step that varies, depending on the particular HVt distribution—a typical one, or one with a reduced maximum.

In embodiments with different read and program modes that selectively use the unreduced Vpass with an unreduced maximum of the highest threshold voltage distribution, or the reduced Vpass' with a reduced maximum of the highest threshold voltage distribution, the ISPP with a larger step is used with the unreduced Vpass with an unreduced maximum of the highest threshold voltage distribution, and the ISPP with a smaller step is used with the reduced Vpass' with a reduced maximum of the highest threshold voltage distribution.

Figure 7:
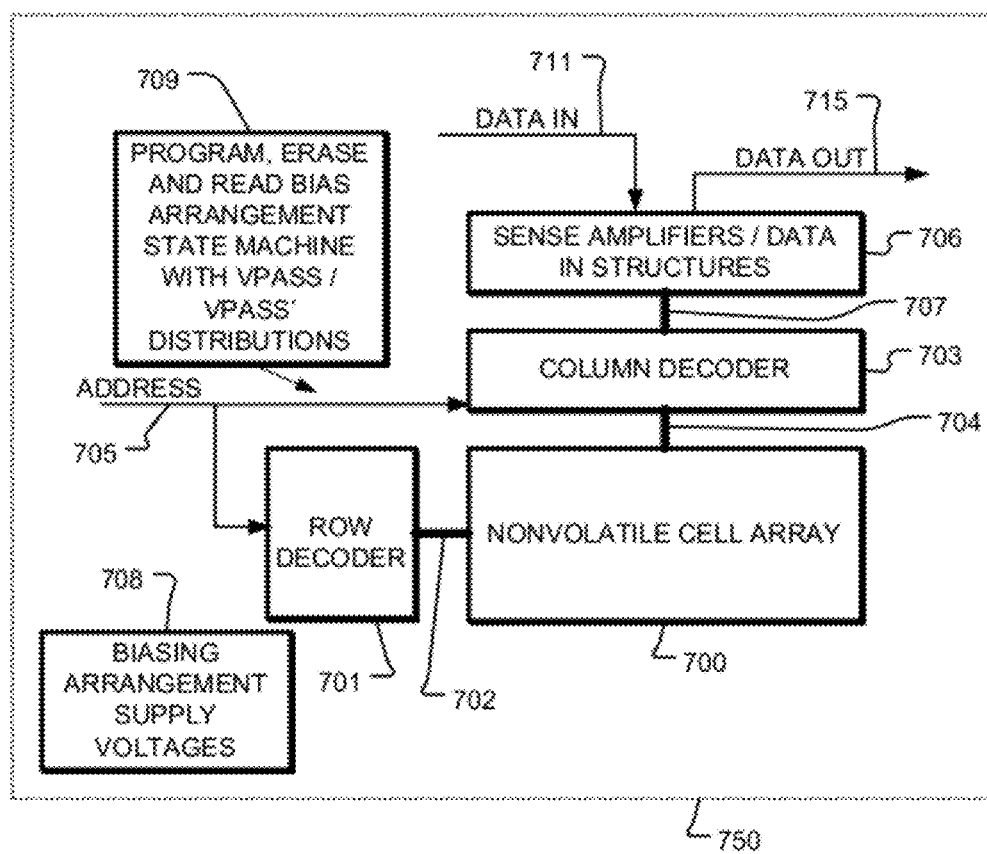
FIG. 7 is a block diagram of a memory integrated circuit with the improvements described herein.

FIG. 7 is a block diagram of a memory integrated circuit with the improvements described herein.

FIG. 7 is a simplified block diagram of an integrated circuit 750 including a memory array 700. A word line (or row) and block select decoder 701 is coupled to, and in electrical communication with, a plurality 702 of word lines and string select lines, and arranged along rows in the memory array 700. A bit line (column) decoder and drivers 703 are coupled to and in electrical communication with a plurality of bit lines 704 arranged along columns in the memory array 700 for reading data from, and writing data to, the memory cells in the memory array 700. Addresses are supplied on bus 705 to the word line decoder and drivers 701 and to the bit line decoder 703. Sense amplifiers and data-in structures in block 706, including current sources for the read, program and erase modes, are coupled to the bit line decoder 703 via the bus 707. Data is supplied via the data-in line 711 from input/output ports on the integrated circuit 750, to the data-in structures in block 706. Data is supplied via the data-out line 715 from the sense amplifiers in block 706 to input/output ports on the integrated circuit 750, or to other data destinations internal or external to the integrated circuit 750. Program, erase, and read bias arrangement state machine circuitry 709 implements the improved and reduced Vpass' voltage and multimode operation (with Vpass or with Vpass'), and controls biasing arrangement supply voltages 708. Alternative embodiments include different instruction codes or an instruction register.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. A memory, comprising:
 a plurality of memory cells arranged in series in a semiconductor body, the series having a first end and a second end, memory cells in the plurality of memory cells having a threshold voltage in one of a first threshold voltage distribution associated with a first data value and a sec- ond threshold voltage distribution associated with a second data value, the first threshold voltage distribution being a lower voltage distribution than the second threshold voltage distribution;
a plurality of word lines, word lines in the plurality of word lines coupled to corresponding memory cells in the plurality of memory cells; and
a control circuit coupled to the plurality of word lines, the control circuit having multiple sets of instructions, including:
   a first set of instructions including program and read instructions, the first set of instructions corresponding to a first version of the second threshold voltage distribution associated with the second data value, the first version of the second threshold voltage distribution having a first version distribution maximum; and
   a second set of instructions including program and read instructions, the second set of instructions corresponding to a second version of the second threshold voltage distribution associated with the second data value, the second version of the second threshold voltage distribution having a second version distribution maximum,
   wherein the first version distribution maximum is larger than the second version distribution maximum.

2. The memory of claim 1, wherein the first version of the second threshold voltage distribution is wider than the second version of the second threshold voltage distribution.

3. The memory of claim 1, wherein the control circuit performs incremental step pulse programming with an incremental step, wherein the incremental step is larger with the program instruction in the first set of instructions than the program instruction in the second set of instructions.

4. The memory of claim 1, wherein the program instruction in the first set of instructions is faster than the program instruction in the second set of instructions.

5. The memory of claim 1, wherein the read instruction in the first set of instructions applies a first read bias arrangement to word lines of the plurality of word lines, and the first read bias arrangement applies a first pass voltage to unselected word lines of the plurality of word lines,
   wherein the read instruction in the second set of instructions applies a second read bias arrangement to word lines of the plurality of word lines, and the second read bias arrangement applies a second pass voltage to unselected word lines of the plurality of word lines,
   wherein the first pass voltage is larger than the second pass voltage.

6. The memory of claim 1, wherein the memory includes the plurality of memory cells and an additional plurality of memory cells,
   wherein the control circuit uses the first set of instructions with the plurality of memory cells, and the control circuit uses the second set of instructions with the additional plurality of memory cells, and data stored in the additional plurality of memory cells is less susceptible to error than data stored in the plurality of memory cells.

7. The memory of claim 1, comprising:
an instruction register storing one of a first value and a second value;
   wherein responsive to the instruction register storing the first value, the program and read instructions correspond to a first version of the second threshold voltage distribution associated with the second data value, the first version of the second threshold voltage distribution having a first version distribution maximum; and
   wherein responsive to the instruction register storing the second value, the program and read instructions correspond to a second version of the second threshold voltage distribution associated with the second data value, the second version of the second threshold voltage distribution having a second version distribution maximum,
   wherein the first version distribution maximum is larger than the second version distribution maximum.

8. The memory of claim 7, wherein the first version of the second threshold voltage distribution is wider than the second version of the second threshold voltage distribution.

9. The memory of claim 7, wherein the control circuit performs incremental step pulse programming with an incremental step, wherein the incremental step is larger with the instruction register storing the first value than with the instruction register storing the second value.

10. The memory of claim 7, wherein the program instruction in the first set of instructions is faster than the program instruction in the second set of instructions.

11. The memory of claim 7, wherein responsive to the instruction register storing the first value, the read instruction applies a first read bias arrangement to word lines of the plurality of word lines, and the first read bias arrangement applies a first pass voltage to unselected word lines of the plurality of word lines,
   wherein responsive to the instruction register storing the second value, the read instruction applies a second read bias arrangement to word lines of the plurality of word lines, and the second read bias arrangement applies a second pass voltage to unselected word lines of the plurality of word lines,
   wherein the first pass voltage is larger than the second pass voltage.

12. The memory of claim 7, wherein the memory includes the plurality of memory cells and an additional plurality of memory cells,
   wherein the control circuit uses the program and read instructions with the instruction register storing the first value with the plurality of memory cells, and the control circuit uses the program and read instructions with the instruction register storing the second value with the additional plurality of memory cells, and data stored in the additional plurality of memory cells is less susceptible to error than data stored in the plurality of memory cells.

13. A method of using pluralities of memory cells arranged in series in a semiconductor body, the series having a first end and a second end, memory cells in the plurality of memory cells having a threshold voltage in one of a first threshold voltage distribution associated with a first data value and a second threshold voltage distribution associated with a second data value, the first threshold voltage distribution being a lower voltage distribution than the second threshold voltage distribution, comprising:
   using a first version of program and read instructions corresponding to a first version of the second threshold voltage distribution associated with the second data value, the first version of the second threshold voltage distribution having a first version distribution maximum; and
   using a second version of program and read instructions corresponding to a second version of the second threshold voltage distribution associated with the second data value, the second version of the second threshold voltage distribution having a second version distribution maximum, wherein the first version distribution maximum is larger than the second version distribution maximum.

14. The method of claim 13, wherein the first version of the second threshold voltage distribution is wider than the second version of the second threshold voltage distribution.

15. The method of claim 13, further comprising:
performing incremental step pulse programming with an incremental step, wherein the incremental step is larger with the first version of the program instruction than with the second version of the program instruction.

16. The method of claim 13, wherein the first version of the program instruction is faster than the second version of the program instruction.

17. The method of claim 13, wherein the first version of the read instruction applies a first read bias arrangement to word lines of a plurality of word lines accessing a plurality of memory cells, and the first read bias arrangement applies a first pass voltage to unselected word lines of the plurality of word lines,
wherein the second version of the read instruction applies a second read bias arrangement to word lines of the plurality of word lines, and the second read bias arrangement applies a second pass voltage to unselected word lines of the plurality of word lines,
wherein the first pass voltage is larger than the second pass voltage.

18. The method of claim 13, wherein data programmed and read with the second version of program and read instructions is less susceptible to error than data programmed and read with the first version of program and read instructions.

19. The method of claim 13, wherein the first version of program and read instructions have different instruction codes than the second version of program and read instructions.

20. The method of claim 13, wherein the first version of program and read instructions share common instruction codes with the second version of program and read instructions, and contents of an instruction register distinguish the first version of program and read instructions from the second version of program and read instructions.

* * * * *